(12) United States Patent
Lee et al.

(10) Patent No.: US 8,012,881 B1
(45) Date of Patent: Sep. 6, 2011

(54) METHOD FOR FORMING CONTACT HOLES IN SEMICONDUCTOR DEVICE

(75) Inventors: Sang-Oh Lee, Gyeonggi-do (KR);
Sung-Kwon Lee, Gyeonggi-do (KR);
Jun-Hyeub Sun, Gyeonggi-do (KR);
Jong-Sik Bang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/854,381

(22) Filed: Aug. 11, 2010

(30) Foreign Application Priority Data

May 31, 2010 (KR) .......................... 10-2010-0051086

(51) Int. Cl.
*H01L 21/302* (2006.01)

(52) U.S. Cl. ........ 438/736; 438/734; 438/735; 438/737; 438/738

(58) Field of Classification Search .................. 438/377, 438/445, 618–624, 637–638, 669–673, 700, 438/748, 734–738
See application file for complete search history.

(56) References Cited

U.S. PATENT DOCUMENTS 7,473,647 B2 * 1/2009 Lee et al. ...................... 438/706
7,829,415 B2 * 11/2010 Cho et al. ...................... 438/268

FOREIGN PATENT DOCUMENTS

KR 1020050022469 3/2005
KR 1020070071659 7/2007

OTHER PUBLICATIONS

Notice of Preliminary Rejection issued from Korean Intellectual Property Office on Jun. 28, 2011.

* cited by examiner

*Primary Examiner* — Dung Anh Le
(74) *Attorney, Agent, or Firm* — IP & T Group LLP

(57) ABSTRACT

A method for forming contact holes in a semiconductor device includes forming a hard mask layer over an etch target layer, forming a first line pattern in the hard mask layer by etching a portion of the hard mask layer through a primary etch process, forming a second line pattern crossing the first line pattern by etching the hard mask layer including the first line pattern through a secondary etch process, and etching the etch target layer by using the hard mask layer including the first line pattern and the second line pattern as an etch barrier.

19 Claims, 16 Drawing Sheets

METHOD FOR FORMING CONTACT HOLES IN SEMICONDUCTOR DEVICE

CROSS-REFERENCE TO RELATED APPLICATIONS

The present application claims priority of Korean Patent Application No. 10-2010-0051086, filed on May 31, 2010, which is incorporated herein by reference in its entirety.

BACKGROUND OF THE INVENTION

Exemplary embodiments of the present invention relate to a technology for fabricating a semiconductor device, and more particularly, to a method for forming contact holes of a semiconductor device.

Pattern shrinkage occupies a core factor for increasing production yield in the development of a semiconductor device. According to the pattern shrinkage, a process of forming a contact hole in a semiconductor device using under 30 nm process is regarded as one of the difficult processes.

Therefore, there are demands for the development of a patterning technology for forming a contact hole having a diameter and space using under 30 nm design rules. To this end, a double patterning technology (DPT) is introduced.

FIGS. 1A to 1E are perspective views illustrating a conventional method for forming contact holes in a semiconductor device, and FIG. 2 is a plan view illustrating contact holes of a semiconductor device fabricated according to conventional technology.

Referring to FIG. 1A, an etch target layer 12, a first hard mask layer 13, and a second hard mask layer 14 are sequentially formed over a substrate 11 where certain structures are formed. Here, to secure the etch selectivity between the first hard mask layer 13 and the second hard mask layer 14, the first hard mask layer 13 and the second hard mask layer 14 may be formed of heterogeneous materials. For example, the first hard mask layer 13 may be formed of an organic material, such as an amorphous carbon layer (ACL), and the second hard mask layer 14 may be formed of an inorganic material, such as an oxide layer.

Subsequently, a first photoresist layer pattern 15 is formed over the second hard mask layer 14. The first photoresist layer pattern 15 is a line/space type, and the ratio of lines (L) to spaces (S) of the first photoresist layer pattern 15 is 1:1.

Referring to FIG. 1B, the second hard mask layer 14 is etched using the first photoresist layer pattern 15 as an etch barrier so as to form a first hard mask pattern 14A which is a line/space type stretched in a first direction.

Subsequently, the first photoresist layer pattern 15 is removed.

Referring to FIG. 1C, a second photoresist layer pattern 16 of a line/space type stretched in a second direction perpendicular to the first direction is formed over the substrate structure including the first hard mask pattern 14A. Here, the ratios of lines (L) to spaces (S) of the first photoresist layer pattern 15 and the second photoresist layer pattern 16 are the same.

Referring to FIGS. 1D and 1E, the first hard mask layer 13 is etched using the first hard mask pattern 14A and the second photoresist layer pattern 16 as etch barriers so as to form a second hard mask pattern 13A. As a result, an opening portion 17 defining an area of a contact hole is formed in a region where the first hard mask pattern 14A and the second hard mask pattern 13A do not cover.

Subsequently, after the second photoresist layer pattern 16 is removed, the etch target layer 12 is etched using the first hard mask pattern 14A and the second hard mask pattern 13A as etch barriers so as to form a plurality of contact holes 18.

Subsequently, when the first hard mask pattern 14A and the second hard mask pattern 13A are removed, it can be seen that the plurality of the contact holes 18 are formed in the etch target layer 12 (see FIGS. 1E and 2).

As the dotted line of FIG. 2 shows, the contact holes 18 are to have a symmetric circular shape, and the spaces between adjacent contact holes 18 in the first and second directions are to be uniform.

According to the conventional technology, however, since the first hard mask layer 13 and the second hard mask layer 14 are formed of heterogeneous materials, there is a concern in that the contact holes 18 are formed asymmetrically. Also, since the contact holes 18 are formed in an asymmetric shape, the space between adjacent contact holes 18 in the first and second directions are not uniform. This is because the etch characteristics of the organic material and the inorganic material are different from each other. Although the first photoresist layer pattern 15 and the second photoresist layer pattern 16 are formed to have the same ratio of lines (L) to spaces (S), the first hard mask pattern 14A and the second hard mask pattern 13A that are formed using the first photoresist layer pattern 15 and the second photoresist layer pattern 16 as the etch barriers may not have the same ratio of lines (L) to spaces (S).

Also, since the first hard mask layer 13 and the second hard mask layer 14 are formed of the heterogeneous materials, different etch conditions, such as etch equipment, etch method, and etchant gas, are to be applied to form the first hard mask pattern 14A and the second hard mask pattern 13A. Therefore, the process becomes complicated and yield is deteriorated.

In addition, since the semiconductor device is formed based on inorganic materials, the first hard mask layer 13 which is formed of an organic material has poor adhesion to the inorganic materials. Therefore, an adhesive layer (not shown) is formed in the upper and lower portions of the first hard mask layer 13. Moreover, since the organic material has inferior etch resistance to the inorganic materials, an auxiliary layer (not shown) is to be formed as well to supplement the etch resistance of the first hard mask layer 13. As a result, since the overall thickness (or height) of the hard mask layer is increased, the asymmetrical formation of the contact holes 18 may become more significant and the process may become more complicated.

Also, the organic material is likely to be deformed or lost at a high temperature, the second hard mask layer 14 formed over the first hard mask layer 13 is to be formed of an inorganic material that may be formed at a low temperature. Therefore, there is limitation in selecting an inorganic material usable for the formation of the second hard mask layer 14.

SUMMARY OF THE INVENTION

An embodiment of the present invention is directed to a method for forming symmetric contact holes using under 30 nm design rules for a semiconductor device.

In accordance with an embodiment of the present invention, a method for forming contact holes in a semiconductor device includes forming a hard mask layer over an etch target layer, forming a first line pattern in the hard mask layer by etching a portion of the hard mask layer through a primary etch process, forming a second line pattern crossing the first line pattern by etching the hard mask layer including the first line pattern through a secondary etch process, and etching the etch target layer by using the hard mask layer including the first line pattern and the second line pattern as an etch barrier.

In accordance with another embodiment of the present invention, a method for forming contact holes in a semiconductor device includes forming a hard mask layer over an etch target layer, forming a first line pattern in the hard mask layer by etching a portion of the hard mask layer through a primary etch process, forming a planarization layer over the hard mask layer including the first line pattern, forming a pattern by selectively etching the planarization layer, forming a second line pattern crossing the first line pattern by using the first line pattern and the pattern as etch barriers and etching the hard mask layer including the first line pattern through a secondary etch process, removing the pattern, and etching the etch target layer by using the hard mask layer including the first line pattern and the second line pattern as an etch barrier.

DESCRIPTION OF SPECIFIC EMBODIMENTS

Figure 1A:
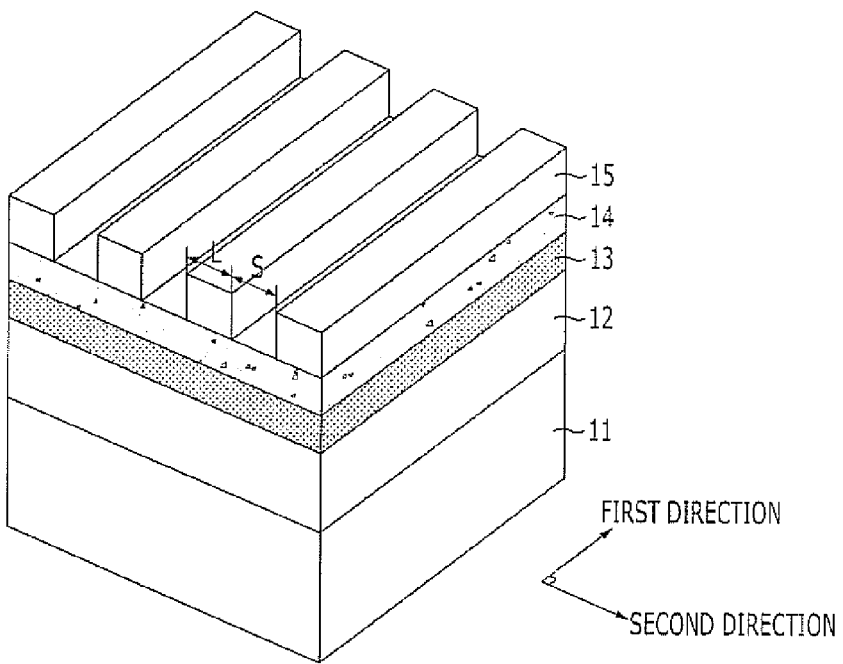
FIGS. 1A to 1E are perspective views illustrating a conventional method for forming contact holes in a semiconductor device.
Figure 1B:
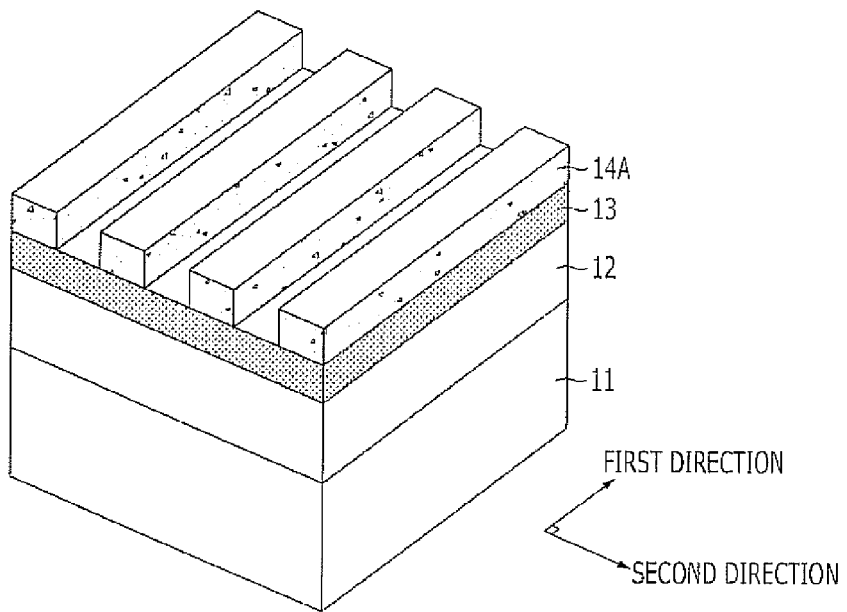
Figure 1C:
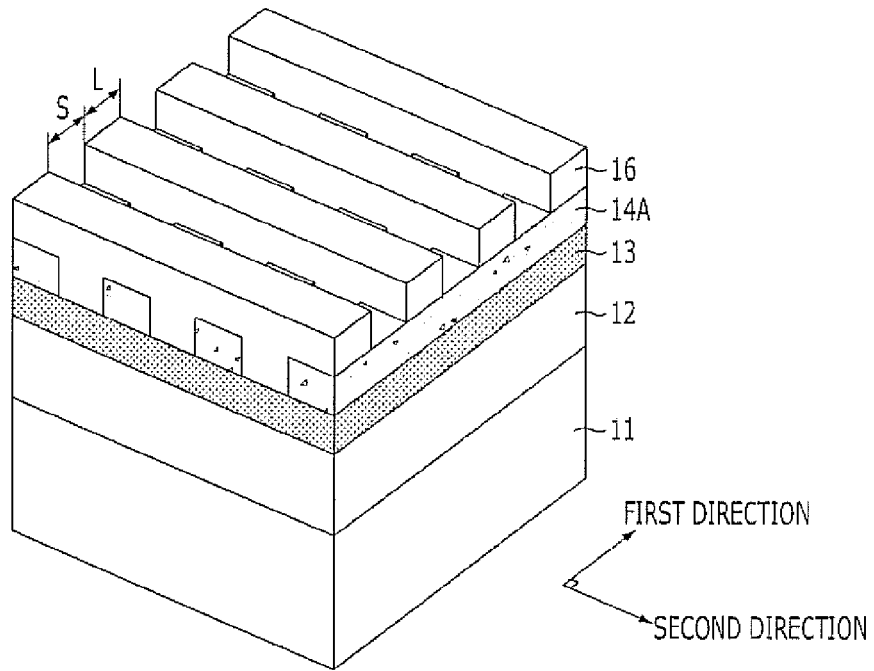
Figure 1D:
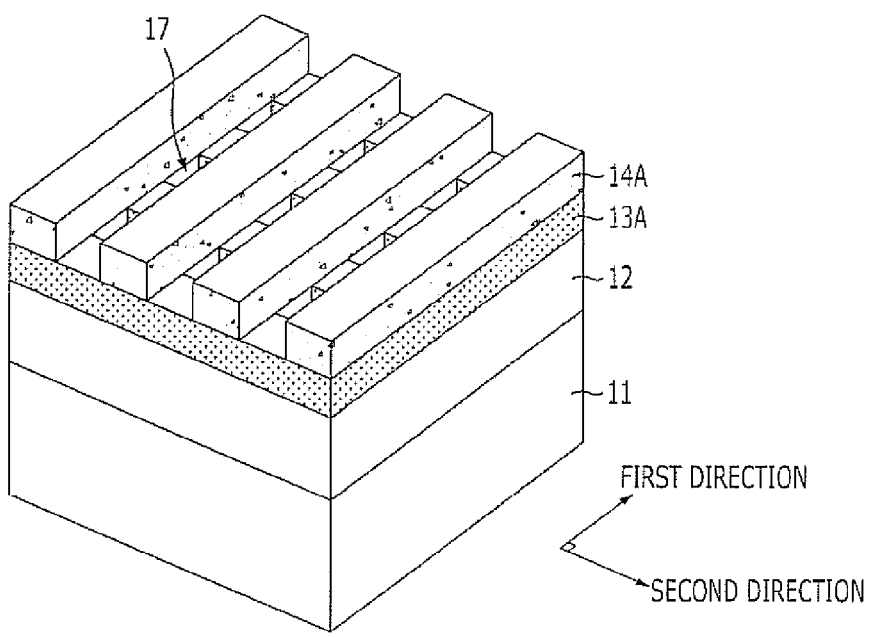
Figure 1E:
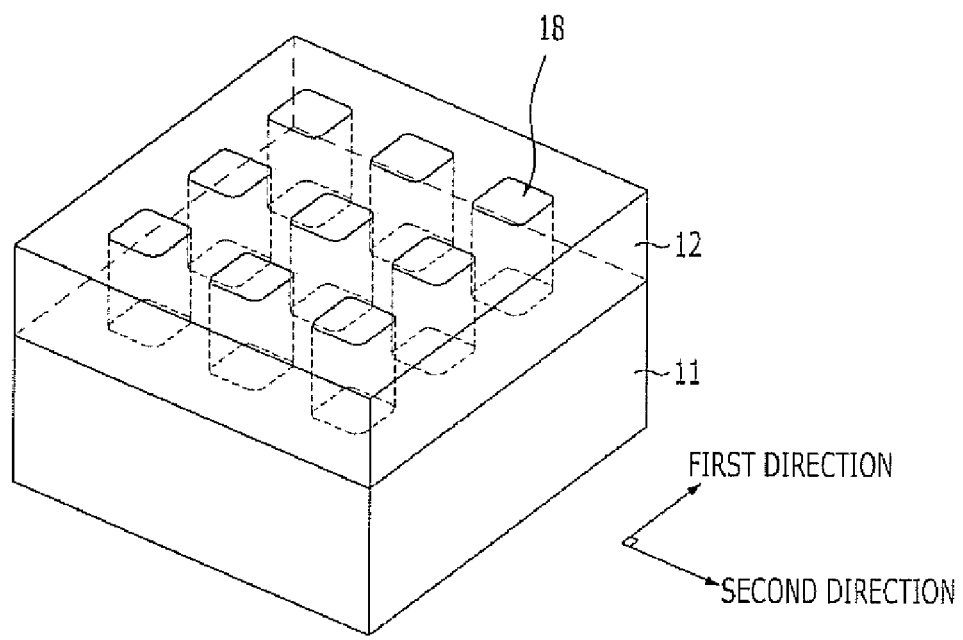
Figure 2:
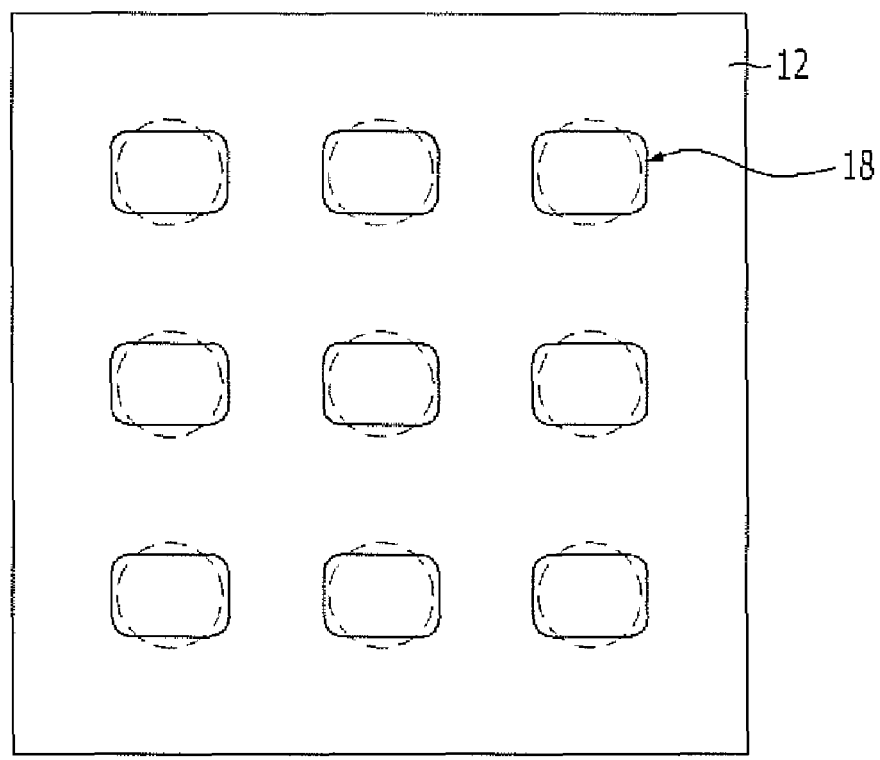
FIG. 2 is a plan view illustrating contact holes of a semiconductor device fabricated according to conventional technology.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The present invention to be described hereafter provides a method for forming contact holes having a diameter and space using under 30 nm design rules. The present invention realizes the contact holes having the diameter and space for under 30 nm process by using a Double Patterning Technology (DPT). Here, since the DPT technology is used to form the contact holes, the semiconductor device according to an embodiment of the present invention uses an inorganic material to form a hard mask layer for forming the contact holes.

Here, the inorganic material includes a compound formed of elements other than carbon (C) and a relatively simple structure of compound including carbon. Most semiconductor devices are formed of inorganic materials. The organic materials are carbon compounds except a carbon simple substance, carbon oxide, carbon salt of metal, cyanide, and carbide. Examples of such organic materials used in a semiconductor device include an amorphous carbon layer (ACL) and a spin on carbon (SOC).

FIGS. 3A to 3F are perspective views illustrating a method for forming contact holes in a semiconductor device in accordance with a first embodiment of the present invention.

Figure 3A:
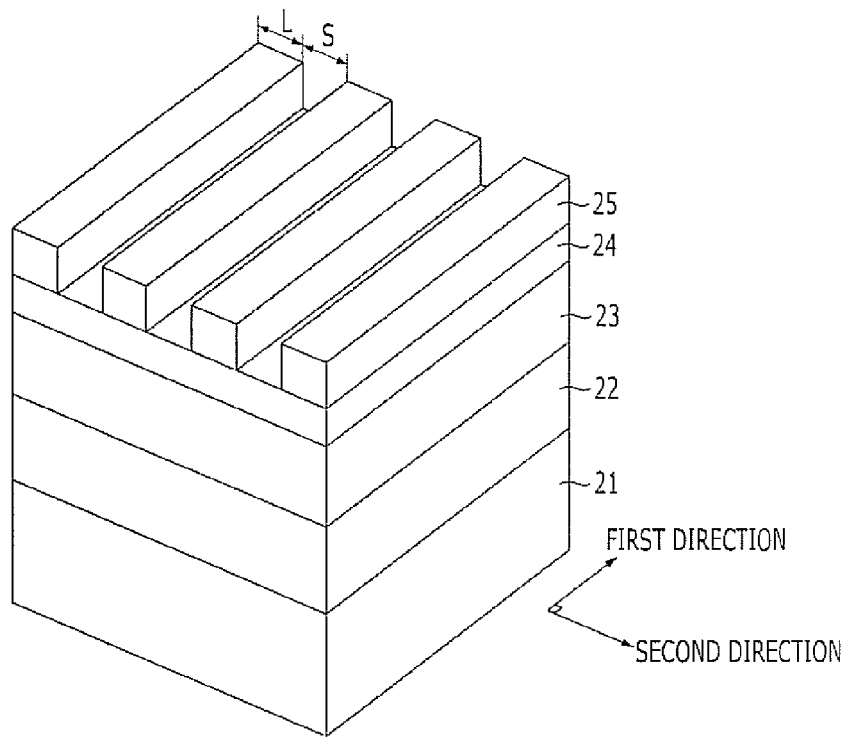
FIGS. 3A to 3F are perspective views illustrating a method for forming contact holes in a semiconductor device in accordance with a first embodiment of the present invention.

Referring to FIG. 3A, an etch target layer 22 is formed over a substrate 21 where a certain structure is formed. According to the embodiment of the present invention, contact holes are formed in the etch target layer 22 through the subsequent process. According to another embodiment of the present invention, contact holes may be formed in the substrate 21 by using the etch target layer 22 with the contact holes formed therein as an etch barrier and etching the substrate 21. The etch target layer 22 may be a polysilicon layer.

Subsequently, a hard mask layer 23 is formed over the etch target layer 22. The hard mask layer 23 functions as an etch barrier protecting the etch target layer 22. Thus, the hard mask layer 23 is formed of an inorganic material having an etch selectivity with respect to the etch target layer 22. In the embodiment of the present invention, the hard mask layer 23 may be formed as a single layer formed of an inorganic material. For example, the hard mask layer 23 may be an oxide layer.

Subsequently, a first sacrificial layer 24 is formed over the hard mask layer 23. The first sacrificial layer 24 provides etch margin for a first photoresist layer pattern 25 to be formed in a subsequent process. The first sacrificial layer 24 may be a stacked layer where an amorphous carbon layer and an anti-reflection layer are sequentially stacked. The amorphous carbon layer provides etch margin, and the anti-reflection layer prevents the first photoresist layer pattern 25 from being deformed due to reflection of a light source when the first photoresist layer pattern 25 is formed in a subsequent process as well as providing etch margin. As for the anti-reflection layer, a silicon oxynitride (SION) layer may be used.

Subsequently, the first photoresist layer pattern 25 is formed over the first sacrificial layer 24 in a line/space type stretched in a first direction. The ratio of lines (L) to spaces (S) of the first photoresist layer pattern 25 is 1:1 (L:S).

Figure 3B:
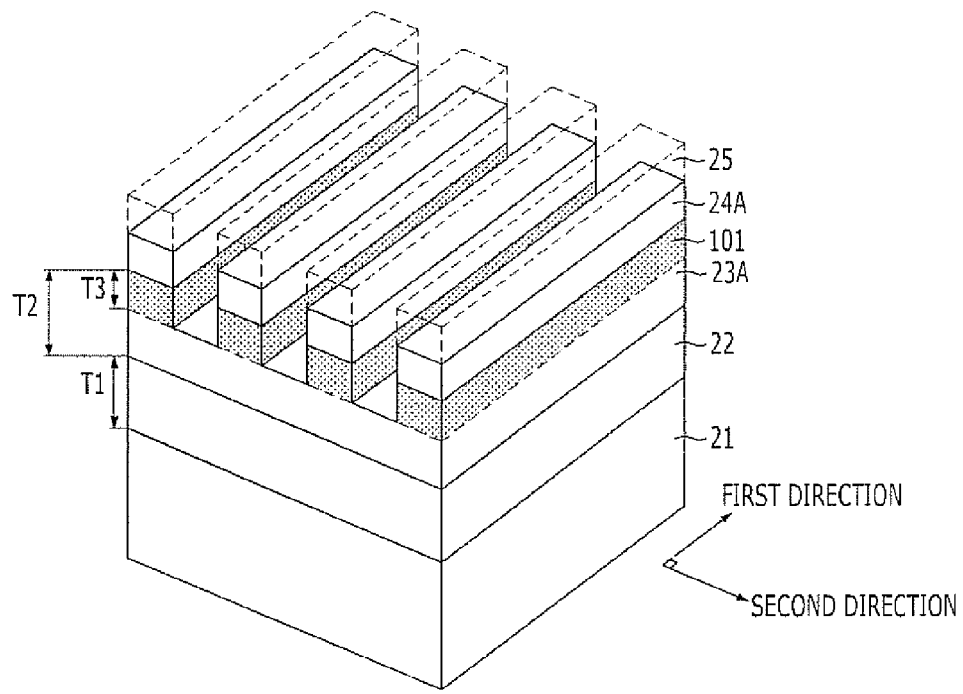

Referring to FIG. 3B, a first sacrificial layer pattern 24A is formed by using the first photoresist layer pattern 25 as an etch barrier and etching the first sacrificial layer 24. Subsequently, a portion of the hard mask layer 23 is etched primarily by using the first sacrificial layer pattern 24A as an etch barrier. The etch process is referred to as a primary etch process, and the primary etch process is a partial etch process of recessing the hard mask layer 23 by a certain thickness. A first line pattern 101 shown in FIG. 3B is a line/space-type structure, i.e., a protruded portion of the partially etched hard mask layer 23.

As a result, the first line pattern 101 stretched in the first direction is formed in the hard mask layer 23. Hereafter, the hard mask layer 23 with the first line pattern 101 is referred to as a hard mask pattern 23A.

The height (or thickness) T3 of the first line pattern 101 formed in the hard mask pattern 23A through the primary etch process may be controlled based on the thickness T1 of the etch target layer 22. More specifically, the thickness T3 of the first line pattern 101 goes in inverse proportion to the thickness T1 of the etch target layer 22 in relation to the total thickness T2 of the hard mask pattern 23A.

After performing the primary etch process by using a fluorocarbon gas (CxFy, where x and y are natural numbers), a fluoromethane gas (CxHyFz, where x, y and z are natural numbers), or a mixed gas thereof as an etch gas, the primary etch process may be further performed by adding at least one selected from the group consisting of oxygen gas ($O_2$), nitrogen gas ($N_2$), helium gas (He), and argon gas (Ar) in order for the sidewall of the first line pattern 101 to have a vertical profile.

Figure 3C:
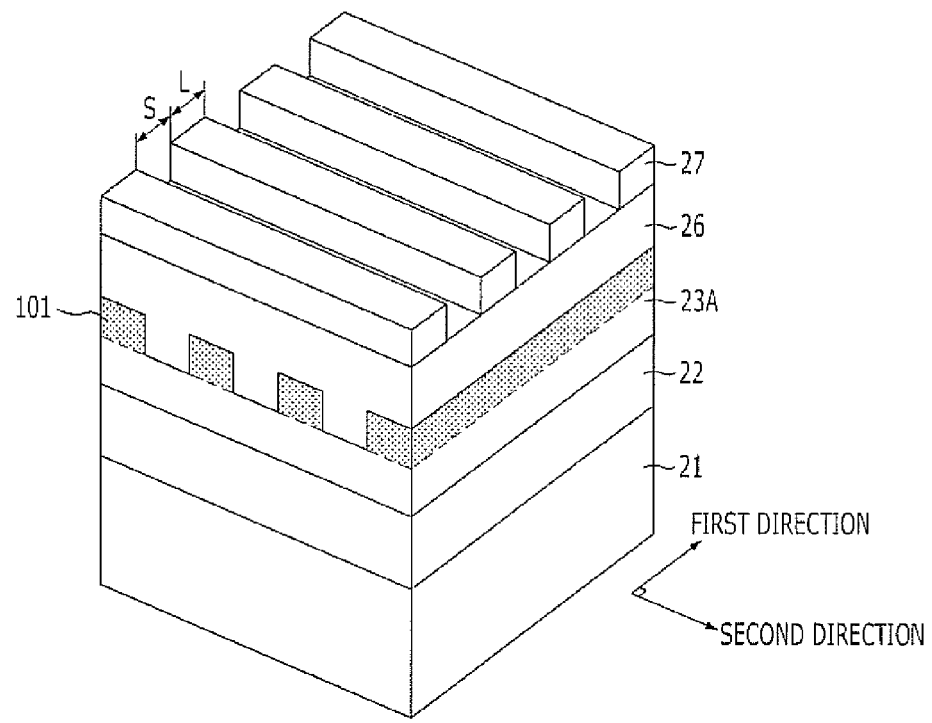

Referring to FIG. 3C, after the first photoresist layer pattern 25 and the first sacrificial layer pattern 24A are removed, a cleaning process is performed to remove byproducts produced during the primary etch process. Here, the first photoresist layer pattern 25 and the first sacrificial layer pattern 24A may be removed through the cleaning process.

The cleaning process may be a dry cleaning process or a wet cleaning process. The dry cleaning process may be performed using a mixed gas of nitrogen ($N_2$) gas, oxygen ($O_2$) gas and hydrogen ($H_2$) gas. The wet cleaning process may be performed using an ammonium hydroxide peroxide mixture (APM) solution or a sulfuric acid peroxide mixture (SPM) solution. Here, the APM solution is a mixed solution of ammonia ($NH_4OH$), hydro peroxide ($H_2O_2$), and deionized water ($H_2O$), and the SPM solution is a mixed solution of sulfuric acid ($H_2SO_4$), hydro peroxide ($H_2O_2$), and deionized water ($H_2O$).

Subsequently, a second sacrificial layer 26 is formed over the hard mask pattern 23A which includes the first line pattern 101. The second sacrificial Layer 26 functions as a planarization layer as well as providing etch margin for a second photoresist layer pattern 27, which is to be formed through a subsequent process. Therefore, the second sacrificial layer 26 may be formed as a stacked layer where an SOC layer and an anti-reflection layer are sequentially stacked. Here, the SOC layer functions as a planarization layer while providing etch margin. The anti-reflection layer protects the second photoresist layer pattern 27 from being deformed due to reflection of a Light source during a process for forming the second photoresist layer pattern 27 while providing etch margin as well. As for the anti-reflection layer, a silicon oxynitride (SiON) layer may be used.

The SOC layer is an organic material layer such as an amorphous carbon layer. The amorphous carbon layer is formed through a Chemical Vapor Deposition (CVD) method and the amorphous carbon layer has inferior planarization characteristic to the SOC layer. The SOC layer is formed through a spin coating method and it has relatively excellent planarization characteristic. As the second sacrificial layer 26 uses the SOC layer as a planarization layer, defocusing effect due to the first line pattern 101 may be effectively prevented during a subsequent process of forming the second photoresist layer pattern 27.

Subsequently, the second photoresist layer pattern 27 of a line/space type stretched in a second direction crossing the first direction at right angles is formed over the second sacrificial layer 26. Here, the ratio of lines (L) to spaces (S) of the second photoresist layer pattern 27 is 1:1 (L:S). The first photoresist layer pattern 25 and the second photoresist layer pattern 27 may be formed using the same mask (or reticle). For example, the second photoresist layer pattern 27 may be formed by rotating the mask (or reticle) of the first photoresist layer pattern 25 though 90° and using the rotated mask.

Figure 3D:
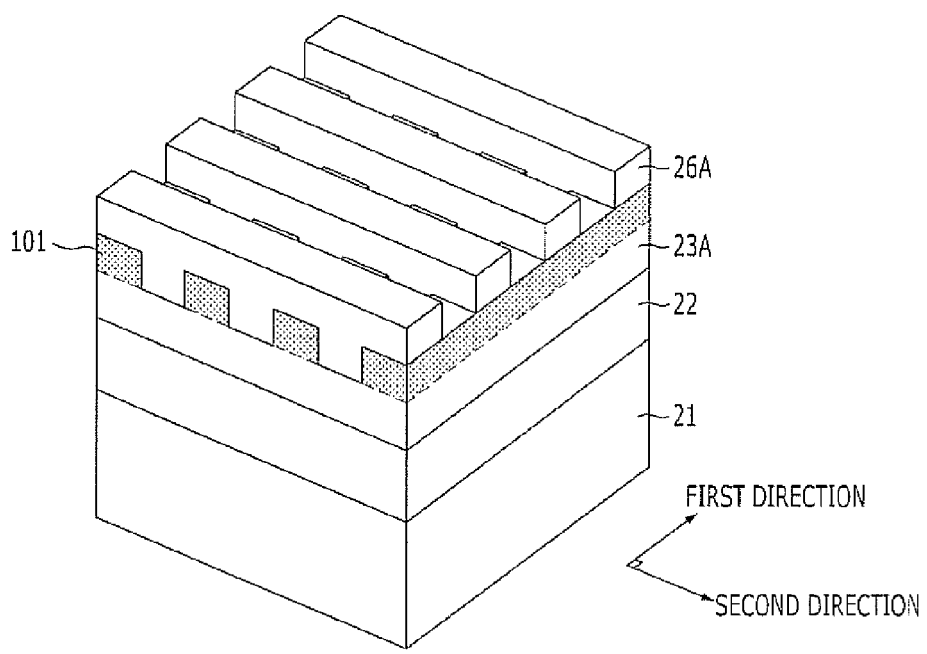
Figure 3E:
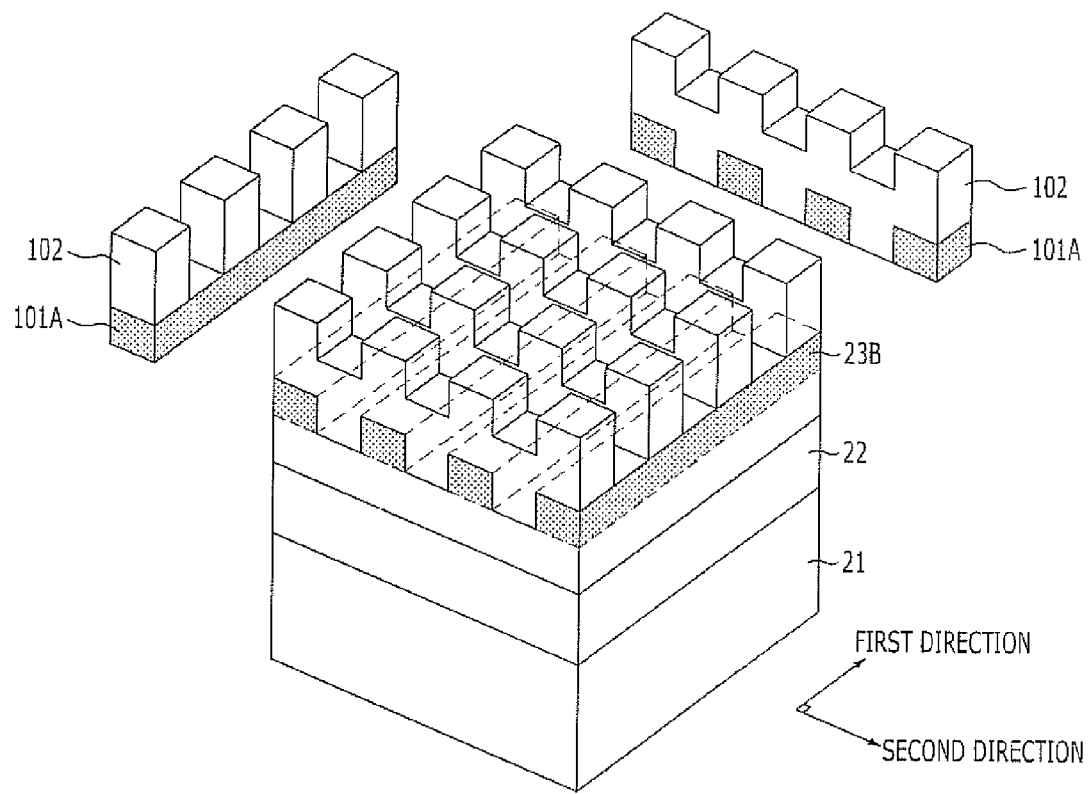

Referring to FIGS. 3D and 3E, the second sacrificial layer 26 is etched using the second photoresist layer pattern 27 as an etch barrier so as to form a second sacrificial layer pattern 26A.

Subsequently, the hard mask pattern 23A including the first line pattern 101 is etched using the second sacrificial layer pattern 26A as etch barriers so as to form a second line pattern 102 stretched in the second direction. This is referred to as a secondary etch process. The secondary etch process is a full-etch process in which the hard mask pattern 23A including the first line pattern 101 is etched until the etch target layer 22 is exposed.

Here, the first line pattern 101 formed in the upper portion of the hard mask pattern 23A may be projected into the lower portion of the hard mask pattern 23A through the secondary etch process as shown in FIG. 3E (101A). Through the process, a structure where the first line pattern 101 and the second line pattern 102 cross each other may be formed. That is, a hard mask pattern 23B including a first line pattern 101A and the second line pattern 102 is formed.

The secondary etch process for forming the second line pattern 102 may be performed using the same etch gas as the etch gas used in the primary etch process for forming the first line pattern 101. This is because the hard mask pattern 23A/23B including the first line pattern 101A and the second line pattern 102 is a single layer formed of one organic material layer. In other words, since the primary etch process and the secondary etch process are etch processes performed for the same etch target, the same etch conditions, e.g., etch equipment, etch method, and etch gas, may be used.

More specifically, the secondary etch process is performed by using a fluorocarbon gas (CxFy, where x and y are natural numbers) or a fluoromethane gas (CxHyFz, where x, y and z are natural numbers), or a mixed gas thereof as an etch gas. The secondary etch process may be further performed by adding at least one selected from the group consisting of oxygen gas ($O_2$), nitrogen gas ($N_2$), helium gas (He), and argon gas (Ar) in order for the sidewall of the second line pattern 102 to have a vertical profile.

Subsequently, after the second photoresist layer pattern 27 and the second sacrificial layer pattern 26A are removed, a cleaning process for removing byproducts generated during the secondary etch process is performed. The second photoresist layer pattern 27 and the second sacrificial layer pattern 26A may be removed through the cleaning process.

The cleaning process may be a dry cleaning process or a wet cleaning process. The dry cleaning process may be performed using a mixed gas of nitrogen ($N_2$) gas, oxygen ($O_2$) gas and hydrogen ($H_2$) gas. The wet cleaning process may be performed using an ammonium hydroxide peroxide mixture (APM) solution or a sulfuric acid peroxide mixture (SPM) solution. Here, the APM solution is a mixed solution of ammonia ($NH_4OH$), hydro peroxide ($H_2O_2$), and deionized water ($H_2O$), and the SPM solution is a mixed solution of sulfuric acid ($H_2SO_4$), hydro peroxide ($H_2O_2$), and deionized water ($H_2O$).

Figure 3F:
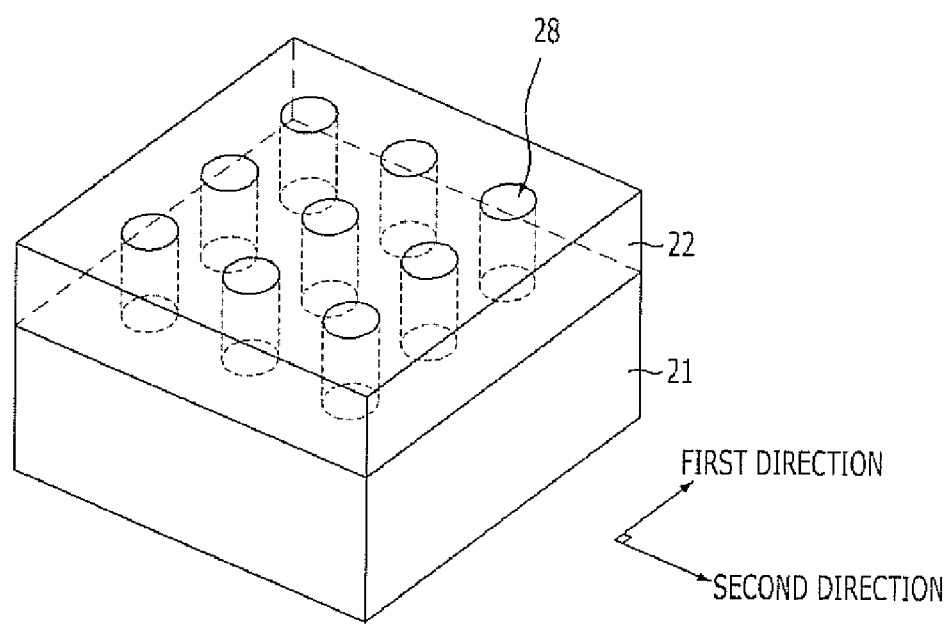

Referring to FIG. 3F, the etch target layer 22 is etched using the hard mask pattern 23B including the first line pattern 101A and the second line pattern 102 as an etch barrier so as to form a plurality of contact holes 28. The etch process for forming the contact holes 28 includes a primary etch process using a mixed gas of hydrogen bromide (HBr) gas and chlorine ($Cl_2$) gas as an etch gas and a second etch process performed by adding at least one selected from the group consisting of oxygen gas ($O_2$), nitrogen gas ($N_2$), helium gas (He), and argon gas (Ar) in order for the sidewall of the contact holes 28 to have a vertical profile.

Through the above-described process, the contact holes 28 may be stably formed to have a diameter and space using under 30 nm process. Here, since the hard mask pattern 23B including the first line pattern 101A and the second line pattern 102 is a single layer formed of an inorganic material layer, it can prevent the contact holes 28 from being formed asymmetrically. Also, the space between contact holes 28 adjacent in the first and second directions may be uniform. Also, the concern that the hard mask pattern is formed of heterogeneous materials, such as a stacked layer of an organic material layer and an inorganic material layer, is alleviated. In addition, any reasonably suitable types of materials may be used for the hard mask pattern 23B.

Since the etch target materials of the primary etch process to and the secondary etch process are the same, the same etch conditions, e.g., etch equipment, etch method, and etch gas, may be used. Therefore, the process may be simplified and the production yield of semiconductor devices may be increased.

FIGS. 4A to 4E are perspective views describing a method for forming contact holes in a semiconductor device in accordance with a second embodiment of the present invention.

Figure 4A:
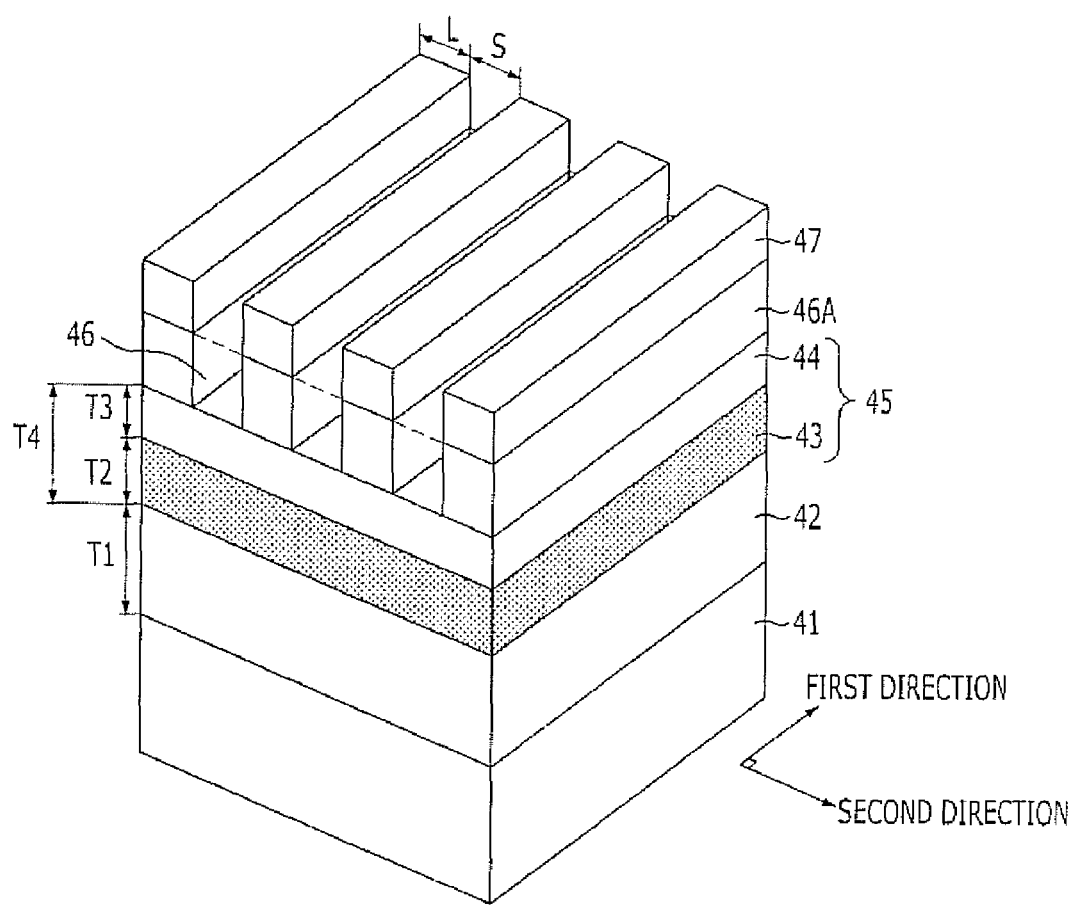
FIGS. 4A to 4E are perspective views illustrating a method for forming contact holes in a semiconductor device in accordance with a second embodiment of the present invention.

Referring to FIG. 4A, an etch target layer 42 is formed over a substrate 41 where a desired structure is formed. According to the embodiment of the present invention, contact holes are formed in the etch target layer 42 through the subsequent process. According to second embodiment of the present invention, contact holes may be formed in the substrate 41 by using the etch target layer 42 with the contact holes formed therein as an etch barrier and etching the substrate 41. The etch target layer 42 may be a polysilicon layer.

Subsequently, a hard mask layer 45 is formed over the etch target layer 42. The hard mask layer 45 functions as an etch barrier protecting the etch target layer 42. Thus, the hard mask layer 45 is formed of an inorganic material having an etch selectivity with respect to the etch target layer 42. In the embodiment of the present invention, the hard mask layer 45 may be formed as a stacked layer where a first inorganic material layer 43 and a second inorganic material layer 44 are sequentially stacked.

The thickness T4 of the hard mask layer 45 may be controlled based on the thickness T1 of the etch target layer 42. The thickness T4 of the hard mask layer 45 is in proportion to the thickness T1 of the etch target layer 42 to provide sufficient etch margin during a subsequent process for forming contact holes. Here, the thickness T3 of the second inorganic material layer 44 constituting the hard mask layer 45 may be controlled by the thickness T1 of the etch target layer 42, too. More specifically, the thickness T3 of the second inorganic material layer 44 is in inverse proportion to the thickness T1 of the etch target layer 42 in relation to the thickness T4 of the hard mask layer 45.

The first inorganic material layer 43 and the second inorganic material layer 44 may be formed of homogeneous materials having different etch rates. The first inorganic material layer 43 and the second inorganic material layer 44 having different etch rates signify that one inorganic material layer is not lost while the other inorganic material layer is patterned.

The thickness T2 of the first inorganic material layer 43 and the thickness T3 of the second inorganic material layer 44 may be different (T2≠T3) based on the thickness T1 of the etch target layer 42. More specifically, when the first inorganic material layer 43 is thicker than the second inorganic material layer 44 (T2>T3), the first inorganic material layer 43 may be formed of a material having faster etch rate than the second inorganic material layer 44. Here, the etch rate is compared using the same etchant.

For example, when the second inorganic material layer 44 is formed of a high-density plasma (HDP) layer, the first inorganic material layer 44 may be formed of a boro-phospho silicate glass (BPSG) layer, which is a homogeneous oxide having the different etch selectivity as the HDP layer, but has faster etch rate than the HDP layer.

Subsequently, a first sacrificial layer 46 is formed over the hard mask layer 45. The first sacrificial layer 46 provides etch margin for a first photoresist layer pattern 47 to be formed in a subsequent process. The first sacrificial layer 46 may be a stacked layer where an amorphous carbon layer and an anti-reflection layer are sequentially stacked. The amorphous carbon layer provides etch margin, and the anti-reflection layer prevents the first photoresist layer pattern 47 from being deformed due to reflection of a light source when the first photoresist layer pattern 47 is formed in a subsequent process as well as providing etch margin.

Subsequently, the first photoresist layer pattern 47 is formed over the first sacrificial layer 46 in a line/space type stretched in a first direction. The ratio of lines (L) to spaces (S) of the first photoresist layer pattern 47 is 1:1 (L:S).

Subsequently, the first sacrificial layer 46 is etched using the first photoresist layer pattern 47 as an etch barrier so as to form a first sacrificial layer pattern 46A.

Figure 4B:
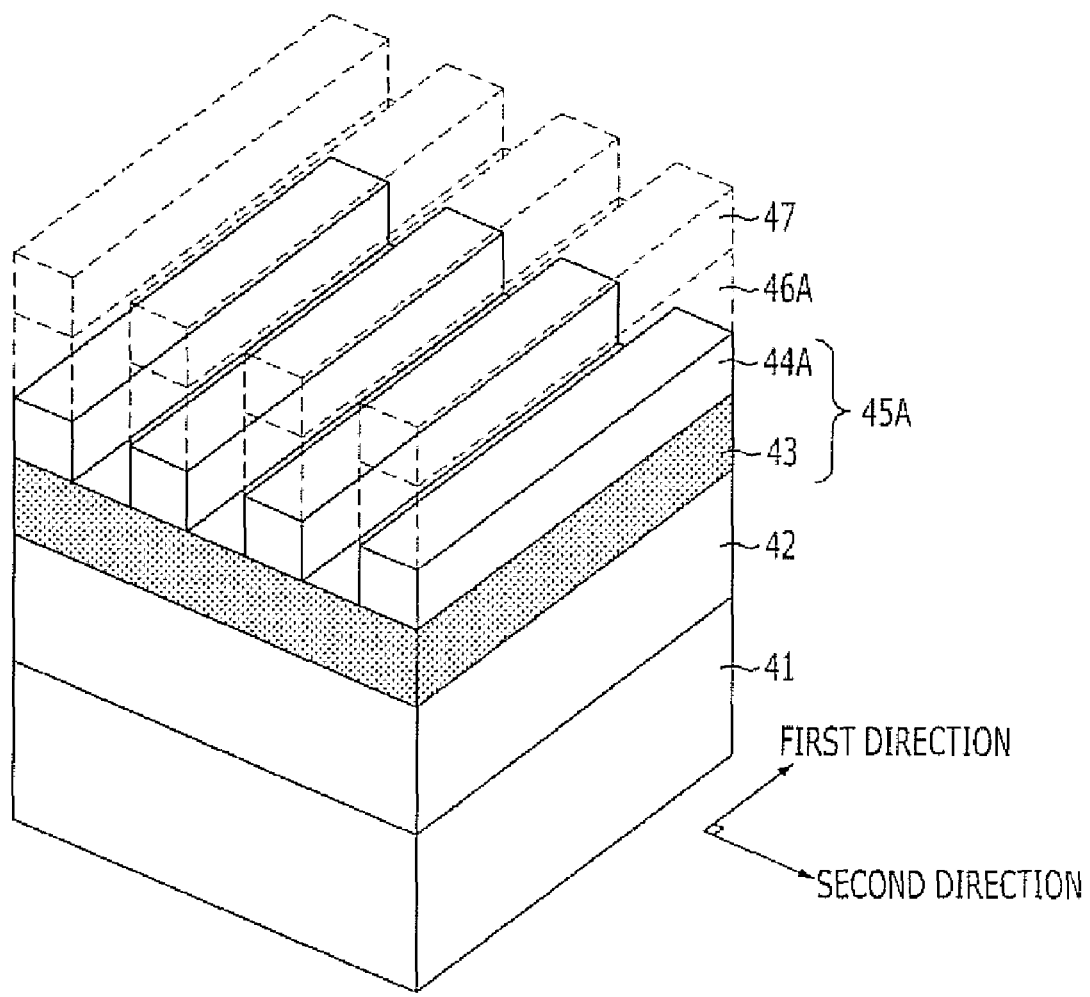

Referring to FIG. 4B, the second inorganic material layer 44 is etched using the first sacrificial layer pattern 46A as an etch barrier so as to form a first line pattern 44A stretched in the first direction. The etch process is referred to as a primary etch process, and the primary etch process is a partial etch process of etching a portion of the hard mask layer 45, which is the second inorganic material layer 44. Hereafter, the hard mask layer 45 with the first line pattern 44A is referred to as a hard mask pattern 45A.

When the first inorganic material layer 43 and second inorganic material layer 44 are formed of a homogeneous oxide material, the primary etch is performed using an oxide etch gas under the condition that the first inorganic material layer 43 is protected from being lost during the process for forming the first line pattern 44A. Through the condition, the etch selectivity between the first inorganic material layer 43 and the second inorganic material layer 44 may be more improved.

Subsequently, after the first photoresist layer pattern 47 and the first sacrificial layer pattern 46A are removed, a cleaning process is performed to remove byproducts produced during the primary etch process. Here, the first photoresist layer pattern 47 and the first sacrificial layer pattern 46A may be removed through the cleaning process.

Figure 4C:
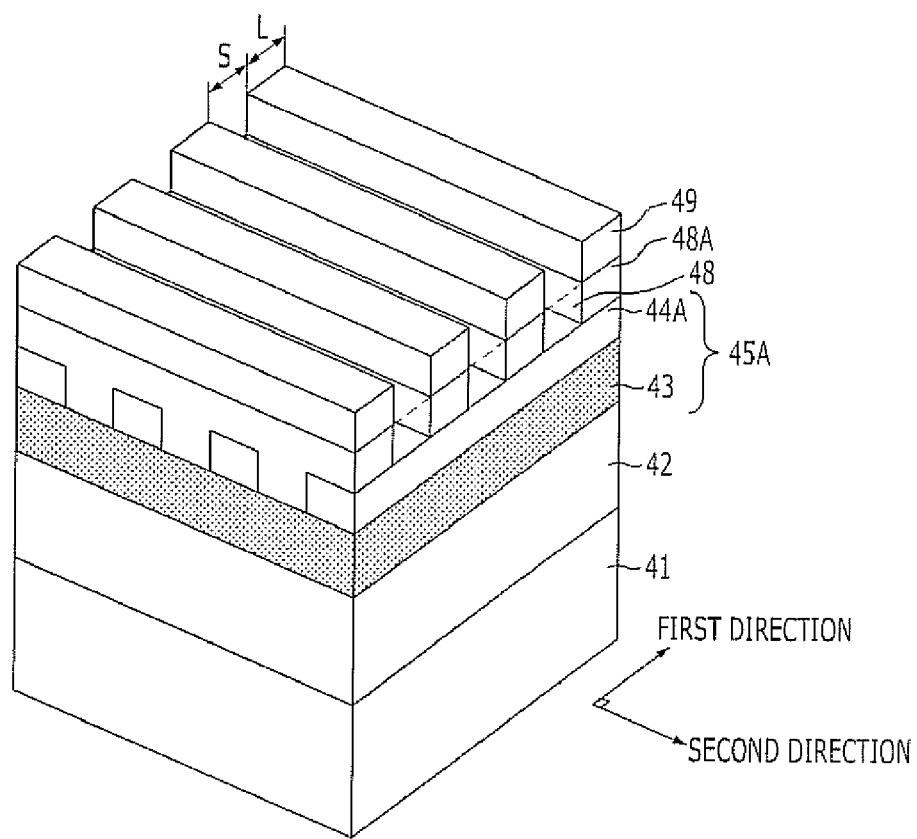

Referring to FIG. 4C, a second sacrificial layer 48 is formed over the hard mask pattern 45A which includes the first line pattern 44A. The second sacrificial layer 48 functions as a planarization layer as well as providing etch margin for a second photoresist layer pattern 49 to be formed through a subsequent process. Therefore, the second sacrificial layer 48 may be formed as a stacked layer where an SOC layer and an anti-reflection layer are sequentially stacked. Here, the SOC layer functions as a planarization layer while providing etch margin. The anti-reflection layer protects the second photoresist layer pattern 49 from being deformed while providing etch margin as well.

Subsequently, the second photoresist layer pattern 49 of a line/space type stretched in a second direction crossing the first direction at right angles is formed over the second sacrificial layer 48. Here, the ratio of lines (L) to spaces (S) of the second photoresist layer pattern 49 is 1:1 (L:S). The first photoresist layer pattern 47 and the second photoresist layer pattern 49 may be formed using the same mask (or reticle). For example, the second photoresist layer pattern 49 may be formed by rotating the mask (or reticle) of the first photoresist layer pattern 47 by 90° and using the rotated mask.

Subsequently, the second sacrificial layer 48 is etched using the second photoresist layer pattern 49 as an etch barrier so as to form a second sacrificial layer pattern 48A.

Figure 4D:
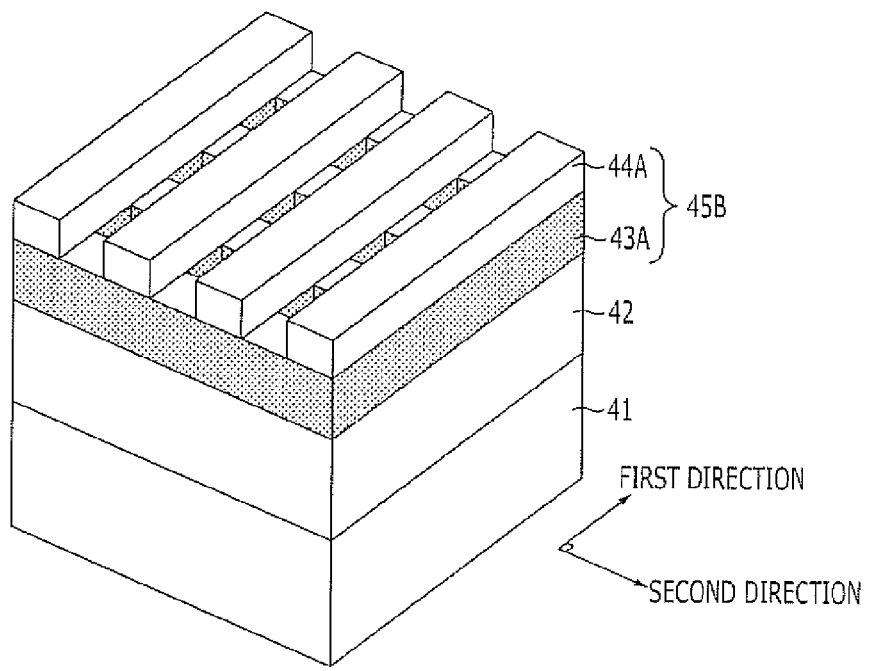

Referring to FIG. 4D, the first inorganic material layer 43 is etched using the first line pattern 44A and the second sacrificial layer pattern 48A as etch barriers so as to form a second line pattern 43A stretched in the second direction. This is referred to as a secondary etch process. The secondary etch process is a full-etch process in which the hard mask pattern 45A including the first line pattern 44A is etched until the etch target layer 42 is exposed. Therefore, a hard mask pattern 45B including the first line pattern 44A and second line pattern 43A is formed.

When the first inorganic material layer 43 and the second inorganic material layer 44 are formed of a homogeneous material, the secondary etch process is performed using an oxide etch gas under the condition that the first line pattern 44A is protected from being lost during the process for forming the second line pattern 43A. by using such a condition, the etch selectivity between the first inorganic material layer 43 and the second inorganic material layer 44 may be even improved.

Here, although the first inorganic material layer 43 is thicker than the second inorganic material layer 44, since the first inorganic material layer 43 is formed of a material having a faster etch rate based on the oxide etch gas than that of the second inorganic material layer 44, the first line pattern 44A and the second line pattern 43A may be protected from being deformed as etch time increases. The etch time is in proportion to the thickness of an etch target layer, and as the etch time becomes longer, etch load increases and pre-established structure and the etch target layer may be lost and deformed.

Subsequently, after the second photoresist layer pattern 49 and the second sacrificial layer pattern 48A are removed, a cleaning process for removing byproducts generated during the secondary etch process is performed. The second photoresist layer pattern 49 and the second sacrificial layer pattern 48A may be removed through the cleaning process.

Figure 4E:
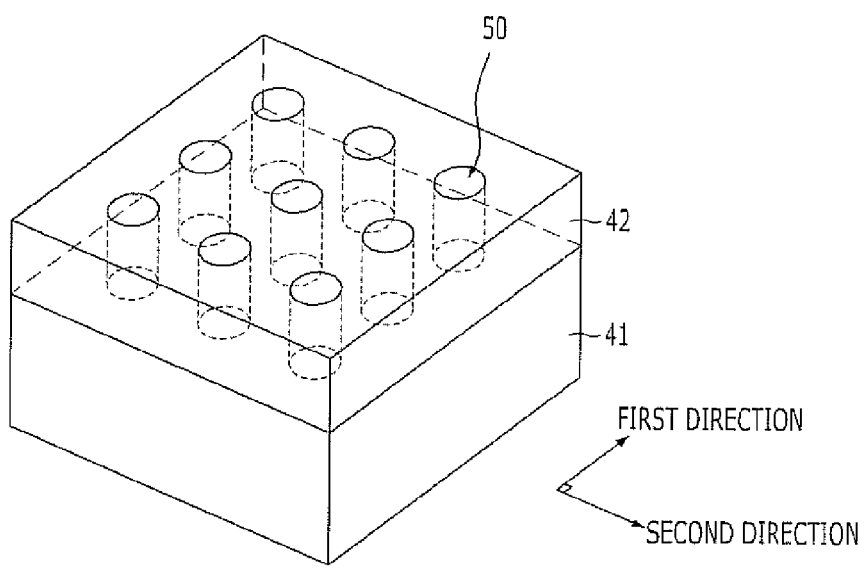

Referring to FIG. 4E, the etch target layer 42 is etched using the hard mask pattern 45B including the first line pattern 44A and the second line pattern 48A as an etch barrier so as to form a plurality of contact holes 50.

Through the above-described process, the contact holes 50 may be stably formed to have a diameter and space using under 30 nm process. Here, since the second inorganic material layer 44 providing the first line pattern 44A and the first inorganic material layer 43 providing the second line pattern 43A have an etch selectivity with respect to each other, the contact holes 50 may be prevented from being formed asymmetrically. Also, the space between contact holes 50 adjacent in the first and second directions may be uniform. Also, the concern that the hard mask pattern is formed of heterogeneous materials, such as a stacked layer of an organic material layer and an inorganic material layer may be alleviated. In addition, any reasonably suitable types of materials that may be used for the hard mask pattern 45B.

Since the etch target materials for the primary etch process and the secondary etch process are the same, the same etch conditions, e.g., etch equipment, etch method, and etch gas, may be used. Therefore, the process may be simplified and the production yield of semiconductor devices may be increased.

FIGS. 5A to 5E are perspective views describing a method for forming contact holes in a semiconductor device in accordance with a third embodiment of the present invention.

Figure 5A:
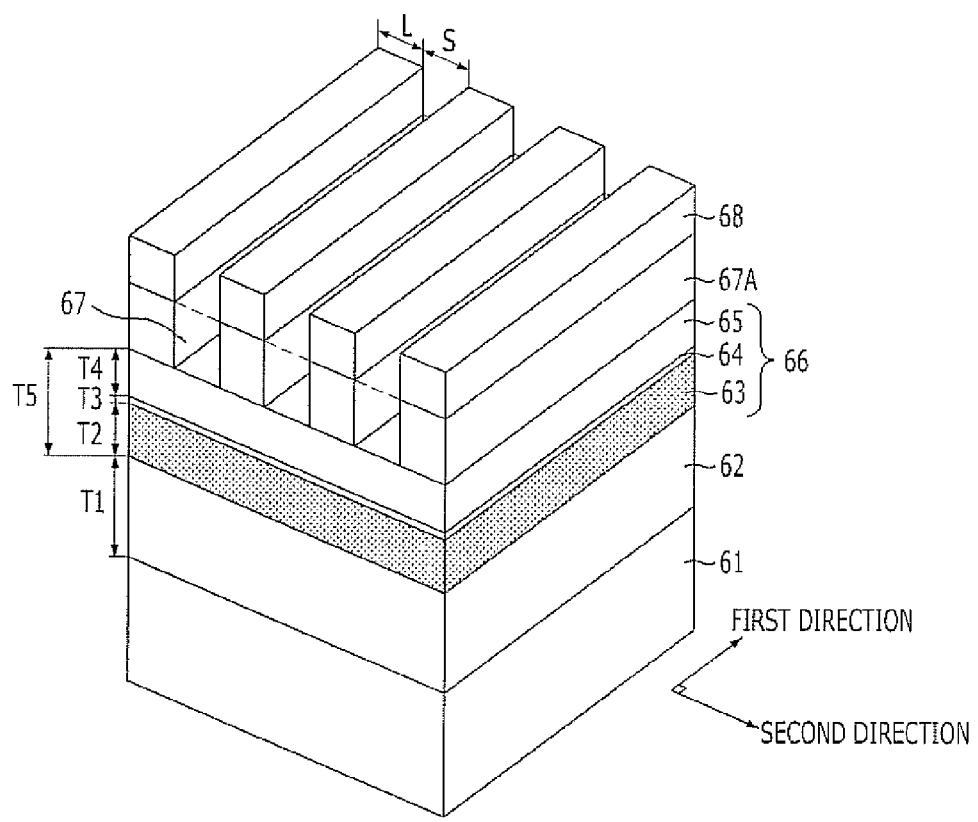
FIGS. 5A to 5E are perspective views illustrating a method for forming contact holes in a semiconductor device in accordance with a third embodiment of the present invention.

Referring to FIG. 5A, an etch target layer 62 is formed over a substrate 61 where a desired structure is formed. According to the embodiment of the present invention, contact holes are formed in the etch target layer 62 through the subsequent process. According to another embodiment of the present invention, contact holes may be formed in the substrate 61 by using the etch target layer 62 with the contact holes formed therein as an etch barrier and etching the substrate 61. The etch target layer 62 may be a polysilicon layer.

Subsequently, a hard mask layer 66 is formed over the etch target layer 62. The hard mask layer 66 functions as an etch barrier protecting the etch target layer 62. Thus, the hard mask layer 66 is formed of an inorganic material having an etch selectivity with respect to the etch target layer 62. In the third embodiment of the present invention, the hard mask layer 66 may be formed as a stacked layer where a first inorganic material layer 63, an etch stop layer 64, and a second inorganic material layer 65 are sequentially stacked.

The thickness T5 of the hard mask layer 66 may be controlled based on the thickness T1 of the etch target layer 62. The thickness T5 of the hard mask layer 66 is in proportion to the thickness T1 of the etch target layer 62 to provide sufficient etch margin during a subsequent process for forming contact holes. Here, the thickness T4 of the second inorganic material layer 65 constituting the hard mask layer 66 may be controlled by the thickness T1 of the etch target layer 62, too. More specifically, the thickness T4 of the second inorganic material layer 65 is in inverse proportion to the thickness T1 of the etch target layer 62 in relation to the thickness T5 of the hard mask layer 66. The etch stop layer 64 is formed to have a thinner thickness T3 than the first inorganic material layer 63 and the second inorganic material layer 65 to alleviate the load during a subsequent etch process, especially, a secondary etch process.

The etch stop layer 64 interposed between the first inorganic material layer 63 and the second inorganic material layer 65 may be formed of a material having an etch selectivity with respect to the first inorganic material layer 63 and the second inorganic material layer 65. It means that the etch stop layer 64 having the etch selectivity and one inorganic material layer are not lost while the other inorganic material layer is patterned.

Here, since the etch stop layer 64 has the etch selectivity with respect to the first inorganic material layer 63 and the second inorganic material layer 65, the first inorganic material layer 63 and the second inorganic material layer 65 may be formed of the same inorganic material. For example, the first inorganic material layer 63 and the second inorganic material layer 65 may be formed as oxide layers. Here, the etch stop layer 64 may be formed as a nitride layer. Hereafter, in the embodiment of the present invention, a case where the first inorganic material layer 63 and the second inorganic material layer 65 are formed of the same inorganic material is described.

Meanwhile, the first inorganic material layer 63 and the second inorganic material layer 65 may be formed of homogeneous materials having an etch selectivity with respect to each other. For example, the first inorganic material layer 63 and the second inorganic material layer 65 may be formed as a BPSG layer and an HDP layer, respectively. Since the BPSG layer and the HDP layer are oxide layers, the etch stop layer 64 may be formed as a nitride layer. Also, the thickness T2 of the first inorganic material layer 63 and the thickness T4 of the second inorganic material layer 65 may be different (T2≠T4) based on the thickness T1 of the etch target layer 62. More specifically, when the first inorganic material layer 63 and the second inorganic material layer 65 are formed of homogeneous materials having the etch selectivity with respect to each other, and the first inorganic material layer 63 is thicker than the second inorganic material layer 65 (T2>T4), the first inorganic material layer 63 may be formed of a material having faster etch rate than the second inorganic material layer 65.

Subsequently, a first sacrificial layer 67 is formed over the hard mask layer 66. The first sacrificial layer 67 provides etch margin for a first photoresist layer pattern 68 to be formed in a subsequent process. The first sacrificial layer 67 may be a stacked layer where an amorphous carbon layer and an anti-reflection layer are sequentially stacked. The amorphous carbon layer provides etch margin, and the anti-reflection layer prevents the first photoresist layer pattern 68 from being deformed due to reflection of a light source when the first photoresist layer pattern 68 is formed in a subsequent process as well as providing etch margin.

Subsequently, the first photoresist layer pattern 68 is formed over the first sacrificial layer 67 in a line/space type stretched in a first direction. The ratio of lines (L) to space (S) of the first photoresist layer pattern 68 is 1:1 (L:S).

Subsequently, the first sacrificial layer 67 is etched using the first photoresist layer pattern 68 as an etch barrier so as to form a first sacrificial layer pattern 67A.

Figure 5B:
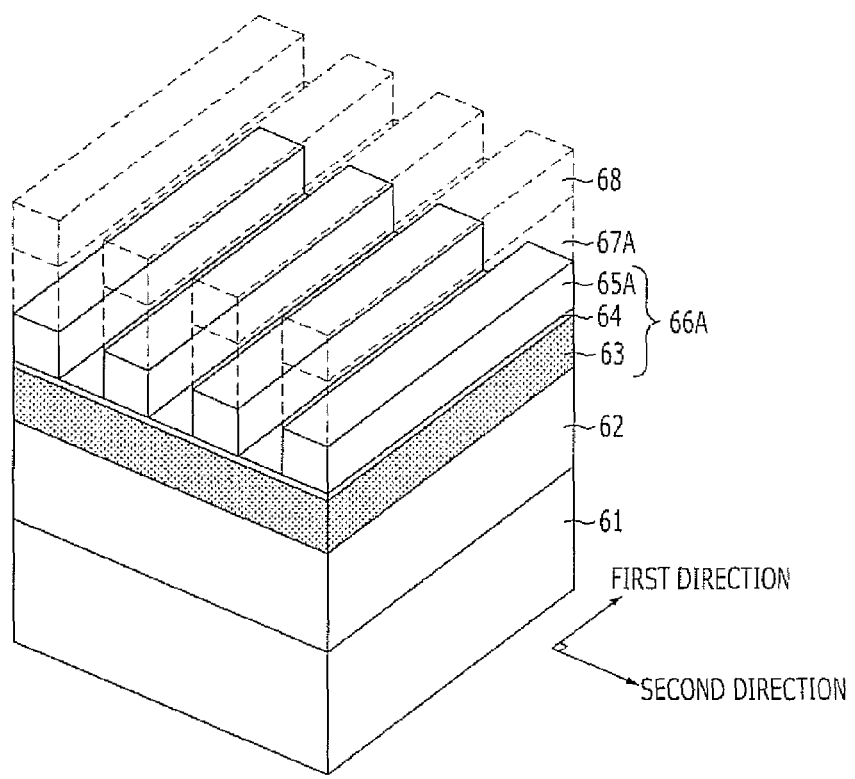

Referring to FIG. 5B, the second inorganic material layer 65 is etched using the first sacrificial layer pattern 67A as an etch barrier so as to form a first line pattern 65A stretched in the first direction. The etch process is referred to as a primary etch process, and the primary etch process is a partial etch process of etching a portion of the hard mask layer 66, which is the second inorganic material layer 65. Hereafter, the hard mask layer 66 with the first line pattern 65A is referred to as a hard mask pattern 66A.

The primary etch process is performed until the etch stop layer 64 is exposed, and the etch stop layer 64 may protect the first inorganic material layer 63 from being lost during the primary etch process.

Subsequently, after the first photoresist layer pattern 68 and the first sacrificial layer pattern 67A are removed, a cleaning process is performed to remove byproducts produced during the primary etch process. Here, the first photoresist layer pattern 68 and the first sacrificial layer pattern 67A may be removed through the cleaning process.

Figure 5C:
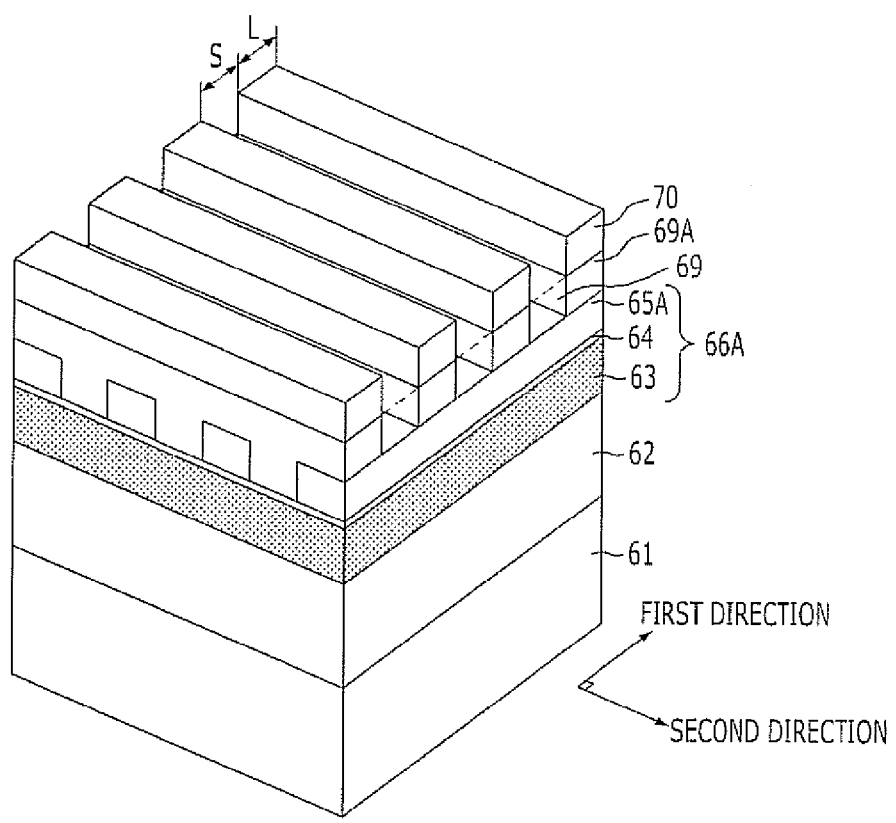

Referring to FIG. 5C, a second sacrificial layer 69 is formed over the hard mask pattern 66A which includes the first line pattern 65A. The second sacrificial layer 69 functions as a planarization layer as well as providing etch margin for a second photoresist layer pattern 70 to be formed through a subsequent process. Therefore, the second sacrificial layer 69 may be formed as a stacked layer where an SOC layer and an anti-reflection layer are sequentially stacked. Here, the SOC layer functions as a planarization layer while providing etch margin. The anti-reflection layer protects the second photoresist layer pattern 70 from being deformed due to reflection of a light source during the process of forming the second photoresist layer pattern 70 while providing etch margin as well.

Subsequently, the second photoresist layer pattern 70 of a line/space type stretched in a second direction crossing the first direction at right angles is formed over the second sacrificial layer 69. Here, the ratio of lines (L) to spaces (S) of the second photoresist layer pattern 70 is 1:1 (L:S). The first photoresist layer pattern 68 and the second photoresist layer pattern 70 may be formed using the same mask (or reticle). For example, the second photoresist layer pattern 70 may be formed by rotating the mask (or reticle) of the first photoresist layer pattern 68 by 90° and using the rotated mask.

Subsequently, the second sacrificial layer 69 is etched using the second photoresist layer pattern 70 as an etch barrier so as to form a second sacrificial layer pattern 69A.

Figure 5D:
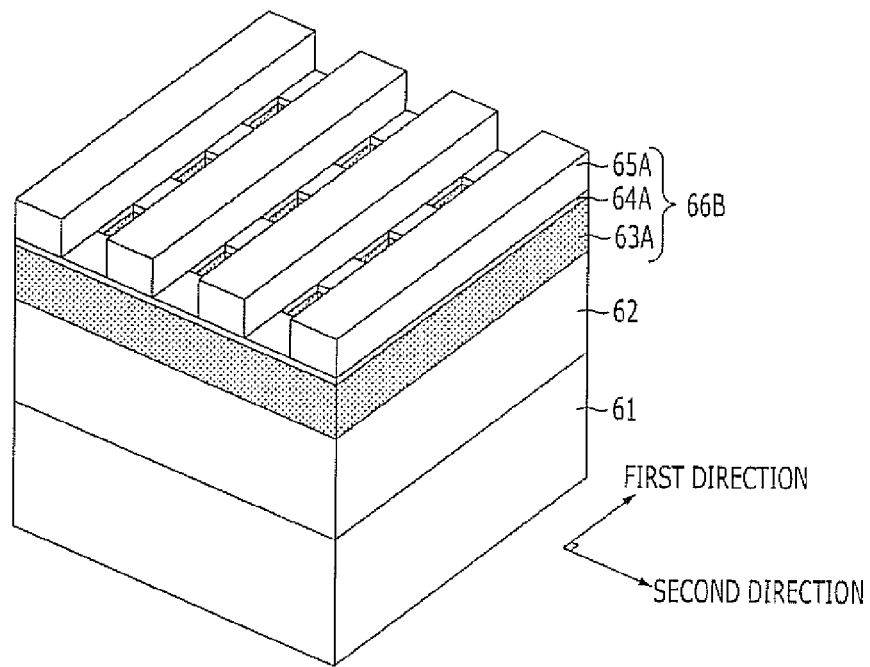

Referring to FIG. 5D, the etch stop layer 64 and the first inorganic material layer 63 are etched using the first line pattern 65A and the second sacrificial layer pattern 69A as etch barriers. This is referred to as a secondary etch process. The secondary etch process is a full-etch process in which the hard mask pattern 66A including the first line pattern 65A is etched until the etch target layer 62 is exposed.

During the secondary etch process, the etch stop layer 64 is etched using the first line pattern 65A and the second sacrificial layer pattern 69A as etch barriers, and an etch stop layer pattern 64A is formed in a mesh pattern. During the secondary etch process, a second line pattern 63A stretched in the second direction is formed by using the first line pattern 65A, the second sacrificial layer pattern 69A, and the etch stop layer pattern 64A as etch barriers and etching the first inorganic material layer 63 until the etch target layer 62 is exposed. Therefore, a hard mask pattern 66B including the first line pattern 65A and the second line pattern 63A is formed.

When the first inorganic material layer 63 and the second inorganic material layer 65 are formed of the same inorganic material, the secondary etch process may be performed under the same etch conditions as those in the primary etch process, e.g., etch equipment, etch method, and etch gas. Here, since the etch stop layer pattern 64A having an etch selectivity with respect to the first inorganic material layer 63 and the second inorganic material layer 65 is an inorganic material layer, the secondary etch process may be performed under the same etch conditions, except the etch gas.

Here, when the second inorganic material layer 65 is thinner than the first inorganic material layer 63 (T2>T4), the first line pattern 65A may be all consumed if the secondary etch process is performed under the same etch conditions as those in the primary etch process. However, although the first line pattern 65A is all removed during the secondary etch process, the subsequent processes are hardly affected due to the etch stop layer pattern 64A formed in the lower portion of the first line pattern 65A. In the embodiment of the present invention, the first line pattern 65A is illustrated to remain when the secondary etch process is completed, for the sake of convenience in description.

Subsequently, after the second photoresist layer pattern 70 and the second sacrificial layer pattern 69A are removed, a cleaning process for removing byproducts generated during the secondary etch process is performed. The second photoresist layer pattern 70 and the second sacrificial layer pattern 69A may be removed through the cleaning process.

Figure 5E:
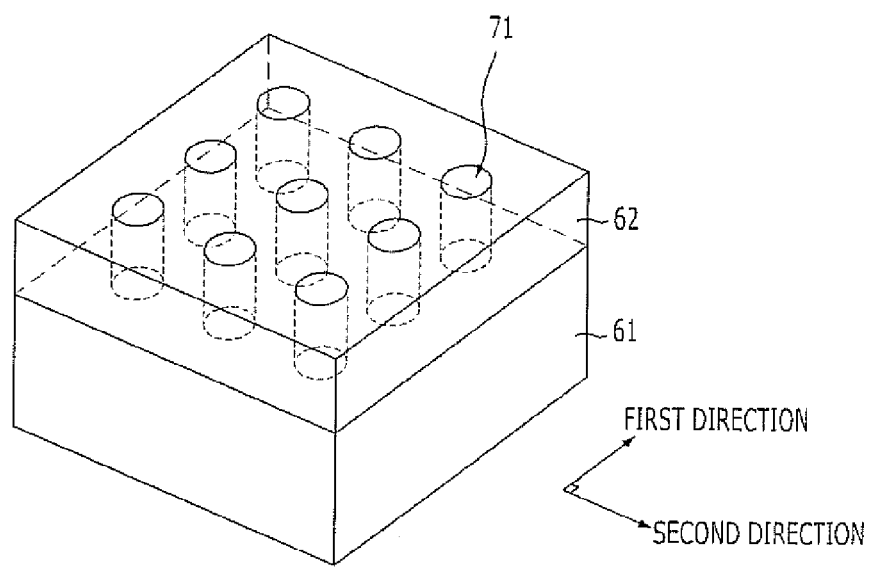

Referring to FIG. 5E, the etch target layer 62 is etched using the hard mask pattern 66B including the mesh-type etch stop layer pattern 64A, the first line pattern 65A, and the second line pattern 63A as an etch barrier so as to form a plurality of contact holes 71.

Through the above-described process, the contact holes 71 may be stably formed to have a diameter and space using under 30 nm process. Here, as the etch stop layer pattern 64A is interposed between the second inorganic material layer 65 providing the first line pattern 65A and the first inorganic material layer 63 providing the second line pattern 63A, it can prevent the contact holes 71 from being formed asymmetrically. Also, since the hard mask pattern 66B is all formed of inorganic materials, it can effectively prevent the contact holes 71 from being formed asymmetrically. Also, the space between contact holes 71 adjacent in the first and second directions may be uniform. Moreover, the concern that the hard mask pattern is formed of heterogeneous materials, such as a stacked layer of an organic material layer and an inorganic material layer, may be alleviated. In addition, any reasonably suitable types of materials that may be used for the hard mask pattern 66B.

Since the etch target materials of the primary etch process and the secondary etch process are the same, the same etch conditions, e.g., etch equipment, etch method, and etch gas, may be used. Therefore, the process may be simplified and the production yield of semiconductor devices may be increased.

According to the technology of the present invention described above, contact holes having a diameter and space for under 30 nm process may be stably formed by forming a hard mask layer to be an inorganic material layer, and making the hard mask layer include a first line pattern and a second line pattern through two etch processes, which are the primary etch process and a secondary etch process. Also, according to the technology of the present invention described above, the contact holes can be prevented from being formed asymmetrically. Moreover, it can make the space between contact holes adjacent in the first and second directions uniform. In addition, the technology of the present invention simplifies the process and improves production yield.

While the present invention has been described with respect to the specific embodiments, it will be apparent to those skilled in the art that various changes and modifications may be made without departing from the spirit and scope of the invention as defined in the following claims.

What is claimed is:

1. A method for forming contact holes in a semiconductor device, comprising:
    forming a hard mask layer over an etch target layer;
    forming a first line pattern in the hard mask layer by etching a portion of the hard mask layer through a primary etch process;
    forming a second line pattern crossing the first line pattern by etching the hard mask layer including the first line pattern through a secondary etch process; and
    etching the etch target layer by using the hard mask layer including the first line pattern and the second line pattern as an etch barrier.

2. The method of claim 1, wherein the hard mask layer is formed as a single layer of one inorganic material layer, or a stacked layer where a plurality of inorganic material layers are stacked.

3. The method of claim 2, wherein when the hard mask layer is formed as the single layer, the primary etch process and the secondary etch process are performed under the same etch conditions.

4. The method of claim 2, wherein when the hard mask layer is formed as the stacked layer, the plurality of inorganic material layers include a first inorganic material layer and a second inorganic material layer stacked sequentially, formed of homogeneous materials, and having an etch selectivity with respect to each other.

5. The method of claim 4, wherein a relatively thicker inorganic material layer between the first inorganic material layer and the second inorganic material layer is formed of an inorganic material having a faster etch rate than that of a relatively thinner inorganic material layer.

6. The method of claim 4, wherein the first line pattern is formed by etching the second inorganic material layer through the primary etch process, and the second line pattern is formed by etching the first inorganic material layer through the secondary etch process.

7. The method of claim 2, wherein when the hard mask layer is the stacked layer, the plurality of inorganic material layers include a first inorganic material layer, an etch stop layer, and a second inorganic material layer stacked sequentially, where the etch stop layer is formed of an inorganic material having an etch selectivity with respect to the first inorganic material layer and the second inorganic material layer.

8. The method of claim 7, wherein the first inorganic material layer and the second inorganic material layer are formed of the same material, or homogeneous materials having an etch selectivity with respect to each other.

9. The method of claim 7, wherein the first line pattern is formed by etching the second inorganic material layer through the primary etch process, and the second line pattern is formed by etching the first inorganic material layer process after a mesh pattern is formed by etching the etch stop layer through the secondary etch.

10. The method of claim 1, wherein a thickness of the first line pattern is in inverse proportion to a thickness of the etch target layer in relation to a total thickness of the hard mask layer is.

11. A method for forming a semiconductor device, comprising:
    forming a hard mask layer over an etch target layer;
    forming a first line pattern in the hard mask layer by etching a portion of the hard mask layer through a primary etch process;
    forming a planarization layer over the hard mask layer including the first line pattern;
    forming a pattern by selectively etching the planarization layer;
    forming a second line pattern crossing the first line pattern by using the first line pattern and the pattern as etch barriers and etching the hard mask layer including the first line pattern through a secondary etch process;
    removing the pattern; and
    etching the etch target layer by using the hard mask layer including the first line pattern and the second line pattern as an etch barrier.

12. The method of claim 11, wherein the hard mask layer is formed as a single layer of one inorganic material layer, or a stacked layer where a plurality of inorganic material layers are stacked.

13. The method of claim 12, wherein when the hard mask layer is formed as the single layer, the primary etch process and the secondary etch process are performed under the same etch conditions.

14. The method of claim 12, wherein when the hard mask layer is formed as the stacked layer, the plurality of inorganic material layers include a first inorganic material layer and a second inorganic material layer stacked sequentially and formed of homogeneous materials, but having an etch selectivity with respect to each other.

15. The method of claim 14, wherein a relatively thicker inorganic material layer between the first inorganic material layer and the second inorganic material layer is formed of an inorganic material having a faster etch rate than that of a relatively thinner inorganic material layer.

16. The method of claim 12, wherein when the hard mask layer is the stacked layer, the plurality of inorganic material layers include a first inorganic material layer, an etch stop layer, and a second inorganic material layer stacked sequentially, where the etch stop layer is formed of an inorganic material having an etch selectivity with respect to the first inorganic material layer and the second inorganic material layer.

17. The method of claim 16, wherein the first inorganic material layer and the second inorganic material layer are formed of the same material, or homogeneous materials having an etch selectivity with respect to each other.

18. The method of claim 16, wherein the first line pattern is formed by etching the second inorganic material layer through the primary etch process, and the second line pattern is formed by etching the first inorganic material layer after a mesh pattern is formed by etching the etch stop layer through the secondary etch process.

19. The method of claim 11, wherein a thickness of the hard mask layer etched during the primary etch process is in inverse proportion to a thickness of the etch target layer in relation to a total thickness of the hard mask layer.

* * * * *